(12) United States Patent
Herges

(10) Patent No.: US 11,715,894 B2
(45) Date of Patent: Aug. 1, 2023

(54) CONTACTING DEVICE FOR THE RESILIENT CONTACTING OF A PRINTED CIRCUIT BOARD WITH A CONTACT ELEMENT FOR A SOLENOID OR A SENSOR FOR A VEHICLE SYSTEM, VEHICLE SYSTEM WITH A CONTACTING DEVICE AND METHOD FOR PRODUCING A CONTACTING DEVICE

(71) Applicant: Knorr-Bremse Systeme fuer Nutzfahrzeuge GmbH, Munich (DE)

(72) Inventor: Michael Herges, Munich (DE)

(73) Assignee: KNORR-BREMSE SYSTEME FUER NUTZFAHRZEUGE GMBH, Munich (DE)

( * ) Notice: Subject to any disclaimer, the term of this patent is extended or adjusted under 35 U.S.C. 154(b) by 134 days.

(21) Appl. No.: 17/279,804

(22) PCT Filed: Sep. 17, 2019

(86) PCT No.: PCT/EP2019/074810
§ 371 (c)(1),
(2) Date: Mar. 25, 2021

(87) PCT Pub. No.: WO2020/064417
PCT Pub. Date: Apr. 2, 2020

(65) Prior Publication Data
US 2021/0344127 A1 Nov. 4, 2021

(30) Foreign Application Priority Data
Sep. 28, 2018 (DE) ..................... 10 2018 123 994.7

(51) Int. Cl.
*H01R 13/24* (2006.01)
*H01R 12/57* (2011.01)
(Continued)

(52) U.S. Cl.
CPC .......... *H01R 12/57* (2013.01); *H01R 12/7076* (2013.01); *H01R 13/2421* (2013.01); *H05K 5/0069* (2013.01); *H01R 2201/26* (2013.01)

(58) Field of Classification Search
CPC . H01R 12/57; H01R 12/7076; H01R 13/2421
(Continued)

(56) References Cited

U.S. PATENT DOCUMENTS 5,281,149 A * 1/1994 Petri ...................... H05K 7/142
439/74
6,551,112 B1 * 4/2003 Li ...................... H01R 13/2421
439/71
(Continued)

FOREIGN PATENT DOCUMENTS

CN 105706308 A 6/2016
CN 105814744 A 7/2016
(Continued)

OTHER PUBLICATIONS

International Search Report for PCT/EP2019/074810 dated Dec. 2, 2019.

*Primary Examiner* — Neil Abrams
(74) *Attorney, Agent, or Firm* — Norton Rose Fulbright US LLP; Gerard Messina

(57) ABSTRACT

A contacting device for resiliently contacting a printed circuit board with a contact element for a solenoid or a sensor for a vehicle system, including a contacting apparatus, including: a helical spring element, which is formed such that it can be clamped in between the printed circuit board and the contact element; and a printed-circuit-board fastening element with a fastening surface and a centering surface opposite the fastening surface, wherein the fastening surface is formed such that it is fastened or can be fastened on the printed circuit board and, in an operating state of the contacting device, at least one portion of the centering (Continued)

surface is arranged so as to protrude into an interior-space portion of an interior space of the spring element in order to guide and/or to center the spring element. Also described are a related vehicle system, a method, a device, and a storage medium.

13 Claims, 5 Drawing Sheets

(51) Int. Cl.
*H01R 12/70* (2011.01)
*H05K 5/00* (2006.01)

(58) Field of Classification Search
USPC .......................................................... 439/81
See application file for complete search history.

(56) References Cited

U.S. PATENT DOCUMENTS

| | | | | |
|---|---|---|---|---|
| 6,717,421 B1 * | 4/2004 | Kazama | ............ | G01R 1/06716 |
| | | | | 324/755.05 |
| 7,029,288 B2 * | 4/2006 | Li | ............... | H01L 23/49811 |
| | | | | 257/E23.068 |
| 7,393,214 B2 * | 7/2008 | DiStefano | .......... | H01R 12/7082 |
| | | | | 439/74 |
| 7,404,717 B2 * | 7/2008 | Kazama | ............ | H01R 13/2421 |
| | | | | 439/66 |
| 7,503,774 B2 * | 3/2009 | Yumi | ................ | H01R 13/2421 |
| | | | | 439/940 |
| 8,052,428 B2 * | 11/2011 | Tsao | ..................... | H01R 12/718 |
| | | | | 439/862 |
| 8,734,190 B2 * | 5/2014 | Schlitzkus | ............ | B60T 13/662 |
| | | | | 439/700 |
| 8,814,577 B2 * | 8/2014 | Nohira | ................... | H01R 43/20 |
| | | | | 29/842 |
| 8,987,912 B2 * | 3/2015 | Yamaguchi | ......... | H01L 23/3107 |
| | | | | 257/691 |
| 9,312,610 B2 * | 4/2016 | Willner | ..................... | H01R 4/48 |
| 9,379,465 B2 * | 6/2016 | Fujii | .................. | H01R 13/2407 |
| 9,634,416 B2 * | 4/2017 | Hein | .................... | H01R 12/718 |
| 9,966,685 B2 * | 5/2018 | Kim | .................. | H01R 13/2421 |
| 2002/0052155 A1 | 5/2002 | Campbell et al. | | |
| 2009/0022662 A1 | 1/2009 | Young et al. | | |
| 2011/0121850 A1 * | 5/2011 | Lee | ..................... | G01R 1/06722 |
| | | | | 324/756.02 |
| 2013/0115802 A1 | 5/2013 | Schlitzkus et al. | | |
| 2016/0276770 A1 | 9/2016 | Hein et al. | | |
| 2021/0344127 A1 * | 11/2021 | Herges | ............... | H01R 13/2421 |

FOREIGN PATENT DOCUMENTS

| | | |
|---|---|---|
| DE | 102013018851 A1 | 5/2015 |
| EP | 2012393 A1 | 1/2009 |
| EP | 2687823 B1 | 11/2016 |
| WO | 2013168711 A1 | 11/2013 |

\* cited by examiner

CONTACTING DEVICE FOR THE RESILIENT CONTACTING OF A PRINTED CIRCUIT BOARD WITH A CONTACT ELEMENT FOR A SOLENOID OR A SENSOR FOR A VEHICLE SYSTEM, VEHICLE SYSTEM WITH A CONTACTING DEVICE AND METHOD FOR PRODUCING A CONTACTING DEVICE

FIELD OF THE INVENTION

The present approach relates to a contacting device for the resilient contacting of a printed circuit board with a contact element for a solenoid or a sensor for a vehicle system, to a vehicle system with a contacting device and to a method for producing a contacting device.

BACKGROUND INFORMATION

Patent document EP 2 687 823 B1 discusses a device for recording and processing sensor measurement values and/or for controlling actuators.

SUMMARY OF THE INVENTION

Against this background, an object of the present approach is to provide an improved contacting device for the resilient contacting of a printed circuit board with a contact element for a solenoid or a sensor for a vehicle system, a vehicle system with an improved contacting device and a method for producing an improved contacting device.

This object may be achieved by a contacting device for the resilient contacting of a printed circuit board with a contact element for a solenoid or a sensor for a vehicle system, a vehicle system with a contacting device and a method for producing a contacting device according to the main claims.

The advantages that can be achieved with the approach presented are that the contacting device presented here provides a resilient contacting arrangement with which the spring element can be quickly and easily centered on the printed circuit board during assembly on the printed circuit board. In an assembled operating state, the spring element is also arranged in a securely guided manner, at least with respect to the printed circuit board.

A contacting device for the resilient contacting of a printed circuit board with a contact element for a solenoid or a sensor for a vehicle system (for example for a braking device for a vehicle, for example a commercial vehicle) has a spring element and a printed-circuit-board fastening element. The spring element is formed helically and such that it can be clamped in between the printed circuit board and the contact element. The printed-circuit-board fastening element has a fastening surface and a centering surface opposite the fastening surface, wherein the fastening surface is formed in a manner such that it is fastened or can be fastened on the printed circuit board and, in an operating state of the contacting device, at least one portion of the centering surface is arranged so as to protrude into an interior-space portion of an interior space of the spring element in order to guide and/or to center the spring element.

The printed circuit board may also be referred to as a circuit board. The contact element may be formed as a component for a solenoid, for example for a braking device, for example for a vehicle. The contact element may however also be formed as a component for some other actuator and/or sensor of some other vehicle system outside a brake system. For example, the contact element may have a magnet and/or a coil wire and/or a magnet housing and/or a sensor housing and/or a sensor, for example a pressure sensor. The spring element may be formed from an electrically conductive material. The centering surface may be a main surface of the printed-circuit-board fastening element, which may be a largest surface in comparison with other surfaces of the printed-circuit-board fastening element. The operating state should be understood as meaning an assembled, clamped state of the spring element between the printed circuit board and the contact element, wherein the printed-circuit-board fastening element is fastened on the printed circuit board and the portion of the centering surface protrudes into the interior-space portion of the spring element. Here, the printed-circuit-board fastening element may be arranged so as to extend into a portion of the length of a main length of the interior space, wherein the portion of the length may be shorter than half the main length. Thus, in the operating state, at least a spring end of the spring element that is facing the printed circuit board may be arranged in a position in a centered manner by the printed-circuit-board fastening element. Moreover, the spring end may be guided out of the interior-space portion or be stabilized by the printed-circuit-board fastening element.

The centering surface may have an elevation or convexity, which in the operating state protrudes into the interior-space portion. For example, the centering surface may have a conical or cone-shaped elevation or convexity, which may extend toward the contact element. The elevation or convexity may take the form of a blind hole, in order to allow material and/or weight of the printed-circuit-board fastening element to be saved.

It is also of advantage if, according to one embodiment, the printed-circuit-board fastening element takes the form of a hat or cap. For example, the cap may have a circular brim, which may be fastened on the printed circuit board, wherein the crown of the cap can protrude into the interior-space portion in the operating state. Such a hat or cap is suitable for use with the helical spring element and is inexpensive to obtain.

The printed-circuit-board fastening element may at least partially comprise a metallic material. The printed-circuit-board fastening element may also be produced completely from metal. Consequently, the printed-circuit-board fastening element may be soldered onto the printed circuit board. Furthermore, the printed-circuit-board fastening element is consequently formed as electrically conductive.

According to one embodiment, a first spring portion of the spring element has a first radius and a second spring portion of the spring element has a second radius, wherein the first radius is greater than the second radius. The second spring portion may for example be arranged or be able to be arranged facing the contact element and the first spring portion may be arranged or be able to be arranged facing the printed circuit board.

It is also of advantage if, according to one embodiment, the contacting device has a pin element with a first end and an opposite second end, wherein the first end is formed such that it is fastened or can be fastened on the contact element and the second end is arranged so as in the operating state of the contacting device to protrude into a further interior-space portion of the interior space of the spring element that is opposite the interior-space portion. Such a pin element allows a further spring end, opposite from the spring end, to be guided or stabilized by the pin element in a centered manner during assembly and in the operating state.

The printed-circuit-board fastening element, for example the aforementioned brim of the printed-circuit-board fastening element, may be arranged in the operating state of the contacting device as a stop for the spring end of the spring element.

The contact element may be formed as a sensor and/or an actuator. Thus, by the contacting device, the printed circuit board can be resiliently contacted with the sensor and/or actuator, for example of a solenoid. For example, the sensor and/or actuator may be electrically contacted or able to be contacted with the circuit board by the contacting device.

The contacting device may also have the contact element and/or the printed circuit board, in particular wherein the printed-circuit-board fastening element may be fastened in a material-bonding manner on the printed circuit board and/or the spring element may be fastened on the contact element. For example, the printed-circuit-board fastening element may be soldered or welded on the printed circuit board in order to create a secure and firm connection.

A vehicle system has a contacting device which is formed in one of the variants presented above. Such a vehicle system may be suitable for use in or with a vehicle, wherein advantageously a centered and guided resilient contact between the printed circuit board and the contact element of the contacting device is ensured.

A method for producing one of the contacting devices presented above comprises a providing step and an arranging step. In the providing step, a helical spring element, which is formed such that it can be clamped in between a printed circuit board and a contact element, and a printed-circuit-board fastening element with a fastening surface and a centering surface opposite the fastening surface are provided, wherein the fastening surface is formed such that it is fastened or can be fastened on the printed circuit board. In the arranging step, the spring element is arranged between the printed circuit board and the contact element, wherein at least one portion of the centering surface is arranged so as in an operating state of the contacting device to protrude into an interior-space portion of an interior space of the spring element in order to guide and/or to center the spring element.

Optionally, the method may also comprise a fastening step, in which the printed-circuit-board fastening element is fastened on the fastening surface of the printed circuit board. The fastening step may be carried out before the arranging step.

The approach presented here also provides a device which is configured to carry out, activate or implement the steps of a variant of a method presented here in corresponding units. This variant of an embodiment of the approach in the form of a device also allows the object on which the approach is based to be achieved quickly and efficiently.

For this purpose, the device may have at least one computing unit for processing signals or data, at least one storage unit for storing signals or data, at least one interface with respect to a sensor or an actuator for reading in sensor signals from the sensor or for outputting data or control signals to the actuator and/or at least one communication interface for reading in or outputting data which are embedded in a communication protocol. The computing unit may be for example a signal processor, a microcontroller or the like, while the storage unit may be a flash memory, an EPROM or a magnetic storage unit. The communication interface may be configured to read in or output data in a wireless and/or line-bound manner, wherein a communication interface that can read in or output line-bound data is able to read in these data for example electrically or optically from a corresponding data transmission line or output them into a corresponding data transmission line.

A device may be understood in the present case as meaning an electrical unit which processes sensor signals and outputs control and/or data signals in dependence on the sensor signals. The device may have an interface, which may be of a hardware and/or software form. In the case of a hardware form, the interfaces may for example be part of what is known as a system ASIC, which comprises a wide variety of functions of the device. It is however also possible that the interfaces are integrated circuits of their own or at least partially consist of discrete components. In the case of a software form, the interfaces may be software modules which are for example present on a microcontroller along with other software modules.

Exemplary embodiments of the approach presented here are explained more specifically in the following description with reference to the figures.

In the description that follows of favorable exemplary embodiments of the present approach, the same or similar designations are used for the elements that are represented in the various figures and act in a similar way, without the description of these elements being repeated.

If an exemplary embodiment includes an "and/or" conjunction between a first feature and a second feature, this is to be interpreted as meaning that the exemplary embodiment has according to one embodiment both the first feature and the second feature and according to a further embodiment either only the first feature or only the second feature.

DETAILED DESCRIPTION

Figure 1:
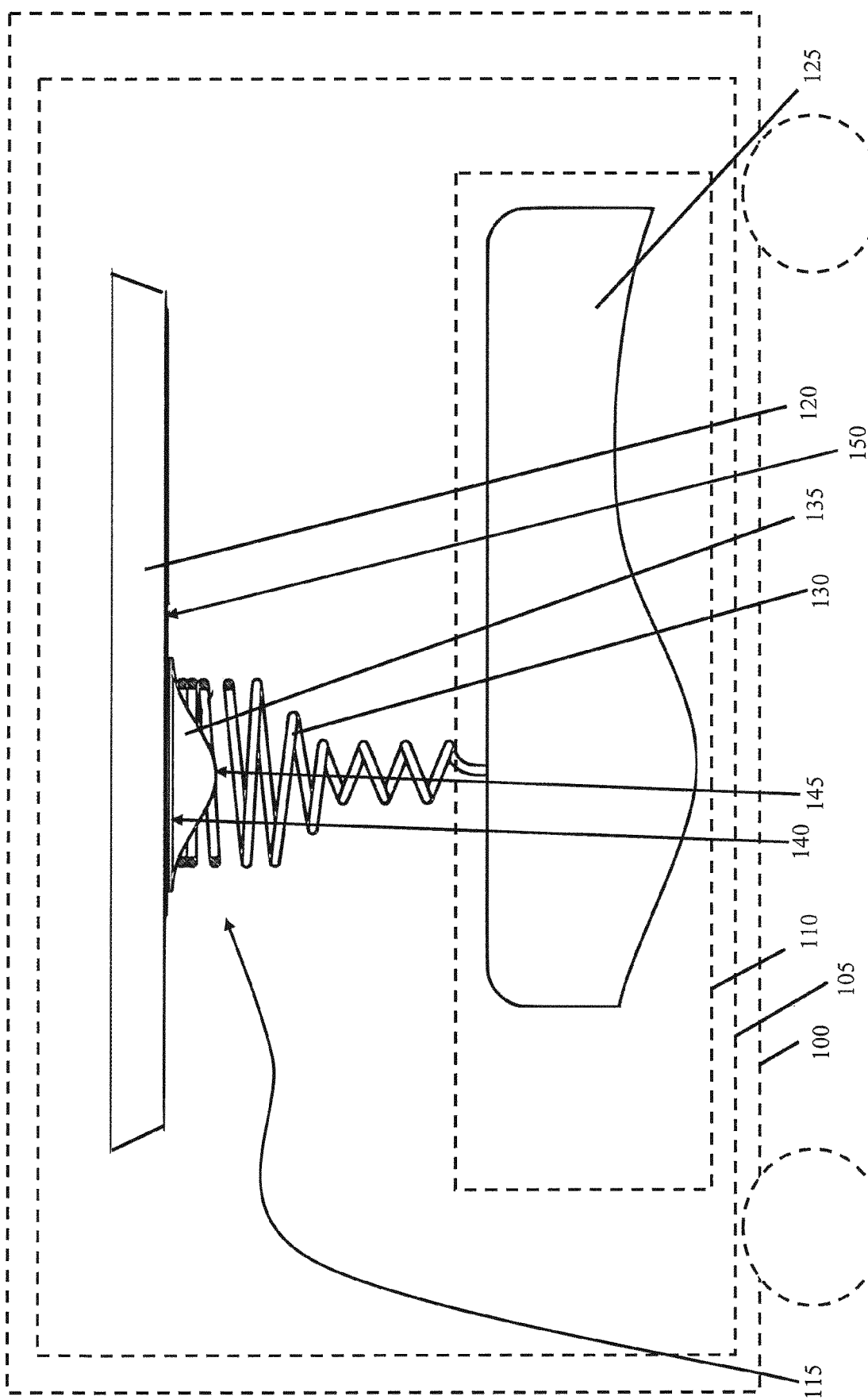
FIG. 1 shows a schematic representation of a vehicle with a vehicle system with a solenoid with a contacting device for the resilient contacting of a printed circuit board with a contact element according to an exemplary embodiment.

FIG. 1 shows a schematic representation of a vehicle 100 with a vehicle system 105 with a solenoid 110 with a contacting device 115 for the resilient contacting of a printed circuit board 120 with a contact element 125 according to an exemplary embodiment.

According to this exemplary embodiment, the vehicle system 105 is merely by way of example arranged in the form of a braking device in or on the vehicle 100, which according to this exemplary embodiment is formed as a heavy goods vehicle or truck or a commercial vehicle. According to this exemplary embodiment, the solenoid 110 is merely by way of example part of the braking device. According to this exemplary embodiment, the contacting device 115 is in turn arranged in or on the solenoid 110 and configured to resiliently contact the printed circuit board 120 with the contact element 125. According to an exemplary embodiment, the printed circuit board 120 and/or the contact element 125 is part of a mechatronic module.

The contacting device 115 has a spring element 130 and a printed-circuit-board fastening element 135. The spring element 130 is clamped in helically and between the printed circuit board 120 and the contact element 125. The printed-circuit-board fastening element 135 has a fastening surface 140 and a centering surface 145 opposite the fastening surface 140, wherein the fastening surface 140 is fastened on the printed circuit board 120 and, in an operating state of the contacting device 115, at least one portion of the centering surface 145 is arranged so as to protrude into an interior-space portion of an interior space of the spring element 130 in order to guide and/or center the spring element 130.

According to this exemplary embodiment, the centering surface 145 has an elevation or convexity, which in the operating state protrudes into the interior-space portion. According to this exemplary embodiment, the elevation or convexity of the printed-circuit-board fastening element 135 extends in length over a length portion of a main length of the interior space, wherein the length portion comprises one seventh of a length of the main length within a range of tolerance of one to 20 percent in terms of a deviation. According to this exemplary embodiment, the main length corresponds to a distance between the printed circuit board 120 and the contact element 125. According to this exemplary embodiment, a center axis or longitudinal axis of the spring element 130 extends perpendicularly to a main surface of the printed circuit board 130 and a main surface of the contact element 125.

According to this exemplary embodiment, a first spring portion of the spring element 130 has a first radius and a second spring portion of the spring element 130 has a second radius, wherein the first radius is greater than the second radius. According to this exemplary embodiment, the second spring portion is arranged facing the contact element 125 and the first spring portion is arranged facing the printed circuit board 120. In the operating state shown here of the contacting device, the printed-circuit-board fastening element 135 is arranged as a stop for a spring end of the spring element 130.

According to this exemplary embodiment, the contact element 125 is formed as a magnet and/or a coil wire and/or a magnet housing. According to an alternative exemplary embodiment, the contact element 125 is formed as a sensor and/or a sensor housing or some other actuator. According to this exemplary embodiment, the printed-circuit-board fastening element 135 is fastened in a material-bonding manner on the printed circuit board 120. According to this exemplary embodiment, the spring element 130 is fastened on the contact element 125. According to this exemplary embodiment, the spring end is formed as a free end of the first spring portion and makes contact with a running-around peripheral edge portion of the centering surface 145 of the printed-circuit-board fastening element 135. According to this exemplary embodiment, a further spring end opposite from the spring end is formed as a free end of the second spring portion and is fastened on the contact element 125. According to this exemplary embodiment, the further spring end is soldered to a coil wire of the contact element 125.

Exemplary embodiments of the contacting device 115 presented here are described once again below with different wording.

The contacting device 115 is configured to allow contacting of an actuator, according to this exemplary embodiment a magnet, or according to an alternative exemplary embodiment a sensor, with a printed circuit board 120.

According to this exemplary embodiment, the helical spring element 130, which may also be referred to as a helical spring, is pressed against the printed-circuit-board fastening element 135 in the form of a conical cap. When the contacting device 115 is being assembled, thanks to the cap the helical spring is advantageously centered automatically in the operating state shown here. As a result, an automatic tolerance compensation takes place. Advantageously, the spring element 130 transfers no, or almost no, structure-borne sound and/or vibrations to the printed circuit board 120 in the operating state. The spring element 130 is advantageously fixed or at least centered and cannot shift laterally. Consequently, no, or almost no, wear occurs on or at the printed circuit board 120 and/or the spring element 130. Movements or micro-movements of the components with respect to one another also scarcely cause any wear. Thanks to the printed-circuit-board fastening element 135, there is no need for any plated-through holes in the printed circuit board 120, at which intermediate layers are perforated. According to this exemplary embodiment, a conductor track 150 is arranged or pressed in between the fastening surface 140 and the printed circuit board. According to this exemplary embodiment, the printed-circuit-board fastening element 135 comprises a metallic material and/or is soldered onto the printed circuit board 150. According to an exemplary embodiment, the printed-circuit-board fastening element 135 is arranged such that it is soldered onto the printed circuit board 150 by a soft melting process, such as reflow soldering.

Figure 2:
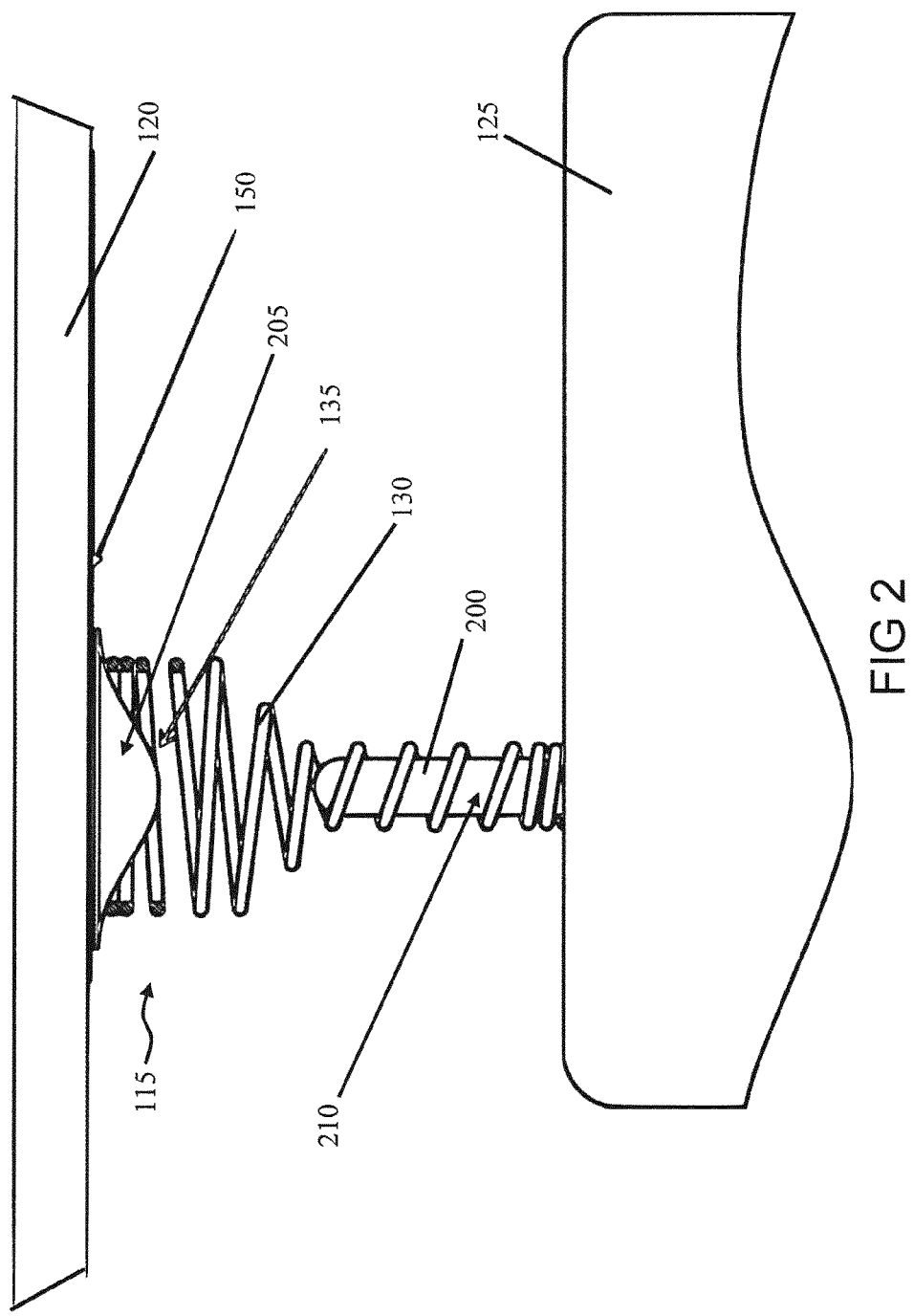
FIG. 2 shows a schematic representation of a contacting device according to an exemplary embodiment.

FIG. 2 shows a schematic representation of a contacting device 115 according to an exemplary embodiment. This may be an exemplary embodiment of the contacting device 115 described on the basis of FIG. 1, with the difference that the contacting device 115 has a pin element 200. The pin element 200 has a first end and a second end opposite from the first end, wherein the first end is fastened on the contact element 125 and the second end is arranged in the operating state shown here of the contacting device 115 so as to protrude into a further interior-space portion 210 of the interior space of the spring element 130 opposite the interior-space portion 205. According to this exemplary embodiment, the printed-circuit-board fastening element 135 and the pin element 200 extend toward one another. The pin element 200 is arranged such that it has the second spring portion of the spring element 130 wound around it.

According to this exemplary embodiment, the pin element 200 extends in length over a further length portion of the main length of the interior space, wherein the further length portion is fifty percent of a length of the main length within a tolerance range of one to 20 percent in terms of a deviation. A pin main length of the pin element 200, arranged in line with the longitudinal axis of the spring element 130, is consequently greater than its length of the printed-circuit-board fastening element 135 arranged in line with the longitudinal axis of the spring element 130. A width of the pin element 200, running perpendicularly to the longitudinal axis of the spring element 130, is smaller than a width of the printed-circuit-board fastening element 135, running perpendicularly to the longitudinal axis of the spring element 130. According to this exemplary embodiment, a middle interior-space portion of the spring element 130 between the interior-space portion 205 and the further interior-space portion 210 is empty. According to an exemplary embodiment, the further spring end is fastened on the contact element 125 and/or the pin element 200. According to an alternative exemplary embodiment, the contact element 125 merely forms a further stop for the further spring end.

Figure 3:
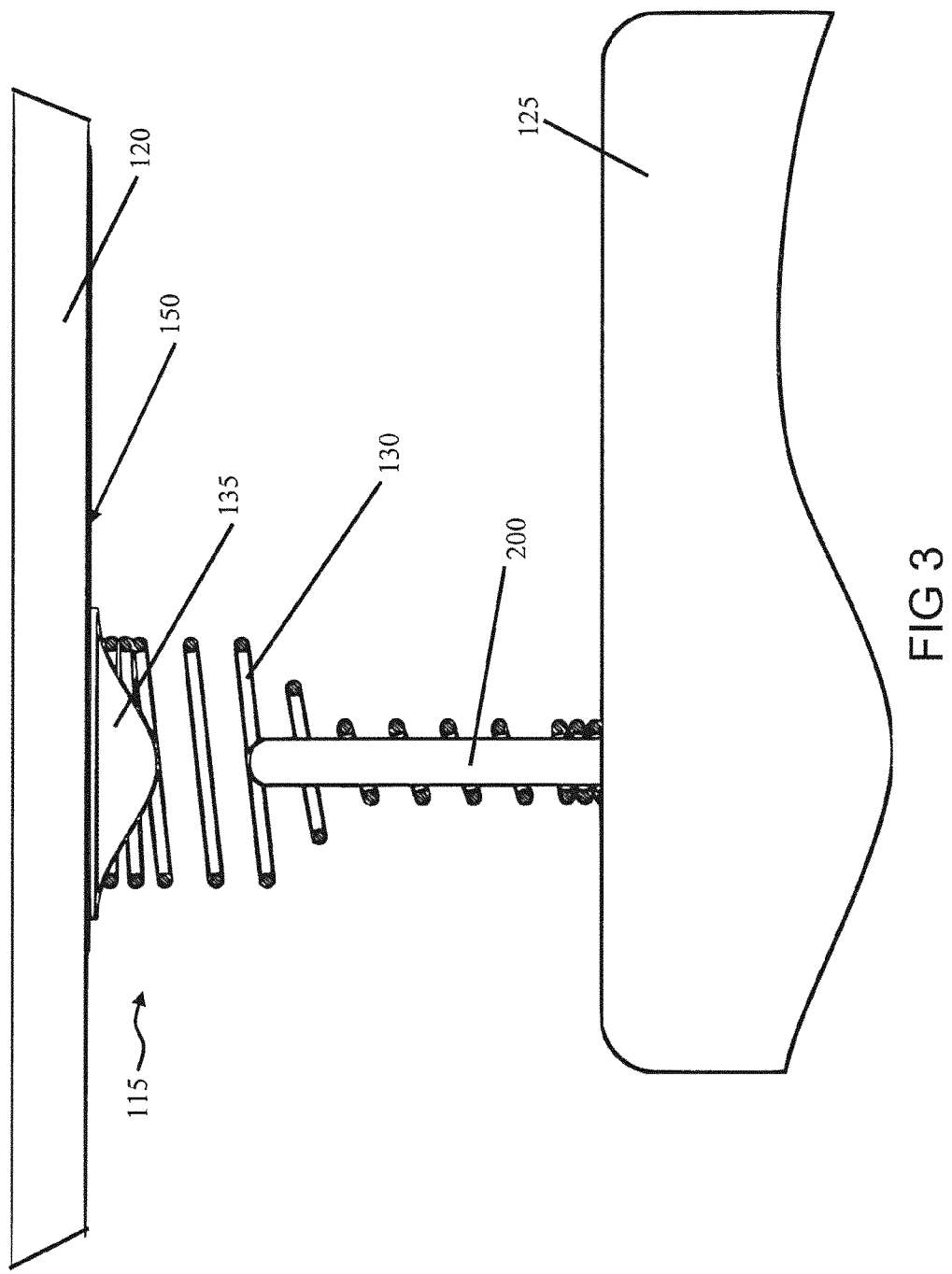
FIG. 3 shows a schematic cross-sectional representation of a contacting device according to an exemplary embodiment.

FIG. 3 shows a schematic cross-sectional representation of a contacting device 115 according to an exemplary embodiment. This may be the contacting device 115 described in FIG. 2. According to this exemplary embodiment, the pin element 200 protrudes into the middle interior-space portion.

Figure 4:
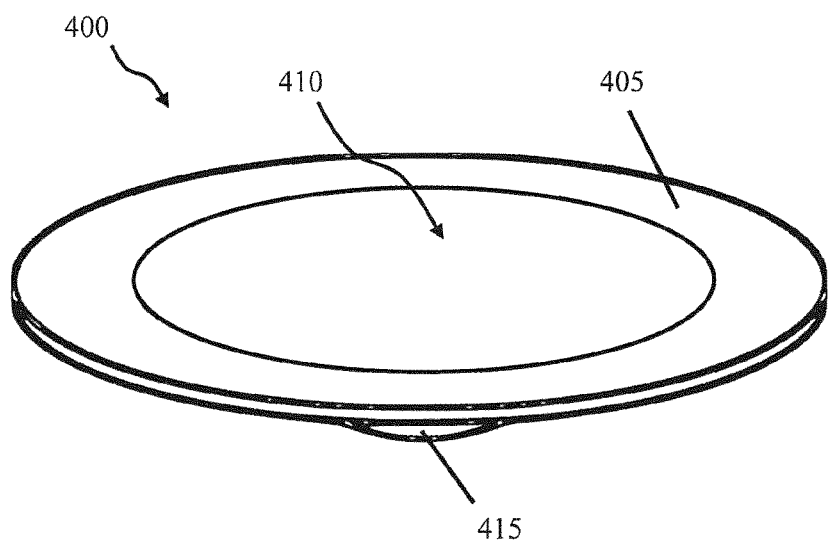
FIG. 4 shows a schematic representation of a cap of a contacting device according to an exemplary embodiment.

FIG. 4 shows a schematic representation of a cap 400 of a contacting device 115 according to an exemplary embodiment. This may be the printed-circuit-board fastening element described in one of the previous figures in the form of a cap 400.

According to this exemplary embodiment, the cap 400 has a planar or flat annular peripheral edge portion 405 and a centrally arranged blind hole 410, which produces the convexity 415. In other words, the cap 400 has a planar circular brim and a convex crown extending out of the plane of the brim.

Figure 5:
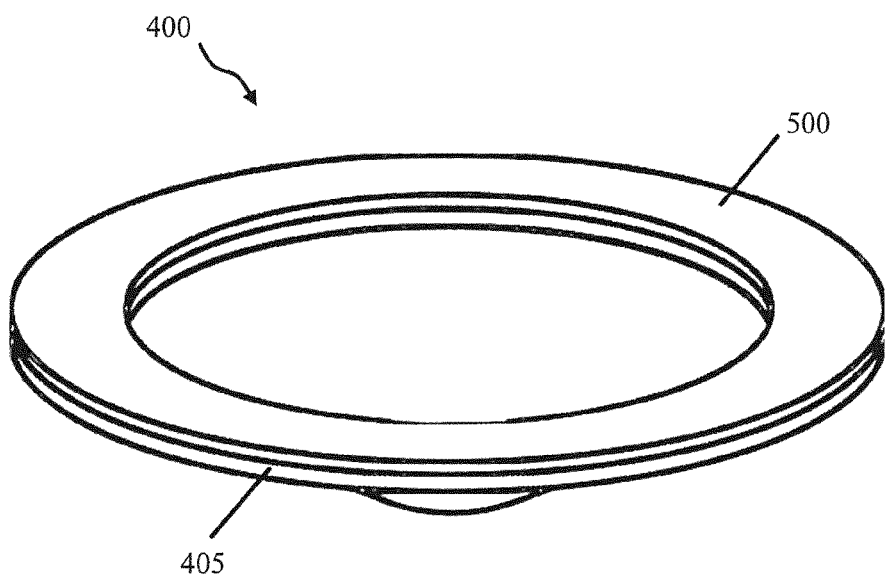
FIG. 5 shows a schematic representation of a cap of a contacting device according to an exemplary embodiment.

FIG. 5 shows a schematic representation of a cap 400 of a contacting device according to an exemplary embodiment. This may be the cap 400 described in FIG. 4, with the difference that the cap 400 additionally has a circular ring 500. According to this exemplary embodiment, the circular ring 500 is formed in a planar manner corresponding to the peripheral edge portion 405 and/or according to this exemplary embodiment is arranged flush against the peripheral edge portion 405. According to an exemplary embodiment, the circular ring 500 comprises a soldering material and/or comprises a further material that differs from the material of the peripheral edge portion 405.

Figure 6:
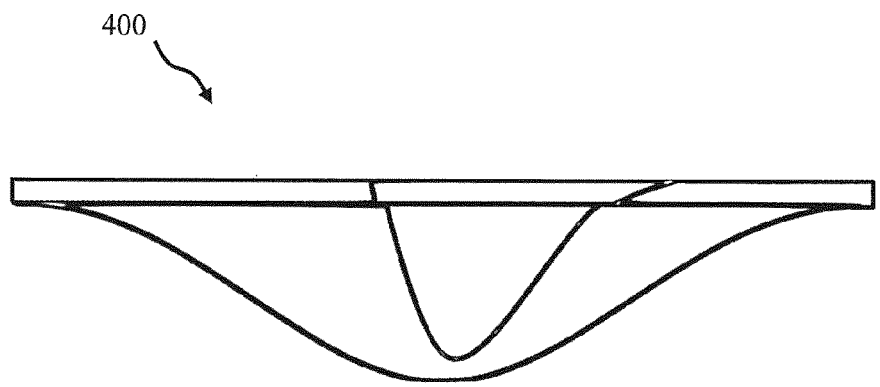
FIG. 6 shows a schematic side view of a cap of a contacting device according to an exemplary embodiment.

FIG. 6 shows a schematic side view of a cap 400 of a contacting device according to an exemplary embodiment. This may be one of the caps 400 described in FIG. 4 or 5.

Figure 7:
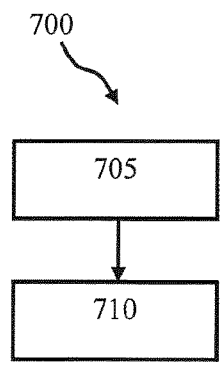
FIG. 7 shows a flow diagram of a method for producing a contacting device according to an exemplary embodiment.

FIG. 7 shows a flow diagram of a method 700 for producing a contacting device according to an exemplary embodiment. This may be one of the contacting devices 115 described on the basis of one of FIGS. 1 to 3.

The method 700 comprises a providing step 705 and an arranging step 710. In the providing step 705, a helical spring element, which is formed such that it can be clamped in between a printed circuit board and a contact element, and a printed-circuit-board fastening element with a fastening surface and a centering surface opposite the fastening surface are provided, wherein the fastening surface is formed such that it is fastened or can be fastened on the printed circuit board. In the arranging step 710, the spring element is arranged between the printed circuit board and the contact element, wherein at least one portion of the centering surface is arranged so as in an operating state of the contacting device to protrude into an interior-space portion of an interior space of the spring element in order to guide and/or to center the spring element.

According to an alternative exemplary embodiment, the method 700 also comprises a fastening step, in which the printed-circuit-board fastening element is fastened on the fastening surface of the printed circuit board. According to an exemplary embodiment, the fastening step is carried out before the arranging step 710.

The method steps presented here may be carried out in a repeated manner and in a sequence other than the sequence described.

THE LIST OF DESIGNATIONS IS AS FOLLOWS

100 Vehicle
105 Vehicle system
110 Solenoid
115 Contacting device
120 Printed circuit board
125 Contact element
130 Spring element
135 Printed-circuit-board fastening element
140 Fastening surface
145 Centering surface
150 Conductor track
200 Pin element
205 Interior-space portion
210 Further interior-space portion
400 Cap
405 Peripheral edge portion
410 Blind hole
415 Convexity
500 Circular ring
700 Method for producing a contacting device
705 Providing step
710 Arranging step

The invention claimed is:

1. A contacting device for resiliently contacting a printed circuit board with a contact element for a solenoid or a sensor for a vehicle system, comprising:
a contacting apparatus, including:
a helical spring element, which is clampable between the printed circuit board and the contact element;
a printed-circuit-board fastening element with a fastening surface and a centering surface opposite the fastening surface, wherein the fastening surface is fastened or fastenable on the printed circuit board and, in an operating state of the contacting device, at least one portion of the centering surface is arranged to protrude into an interior-space portion of an interior space of the spring element to guide and/or to center the spring element; and
a pin element with a first end and an opposite second end, wherein the first end is fastened or fastenable on the contact element and the second end is arranged, in the operating state of the contacting device, to protrude into a further interior-space portion of the interior space of the spring element that is opposite the interior-space portion;
wherein the centering surface has an elevation or a convexity, which in the operating state protrudes into the interior-space portion, and
wherein the elevation or convexity of the printed-circuit-board fastening element extends in length over a length portion of a main length of the interior space, wherein the length portion is a fraction of a length of the main length within a range of tolerance of one to 20 percent in terms of a deviation, wherein the main length corresponds to a distance between the printed circuit board and the contact element, and wherein a center axis or longitudinal axis of the spring element extends perpendicularly to a main surface of the printed circuit board and a main surface of the contact element.

2. The contacting device of claim 1, wherein the centering surface has an elevation or a convexity, which in the operating state protrudes into the interior-space portion.

3. The contacting device of claim 1, wherein the printed-circuit-board fastening element takes the form of a hat or cap.

4. The contacting device of claim 1, wherein the printed-circuit-board fastening element at least partially includes a metallic material.

5. The contacting device of claim 1, wherein a first spring portion of the spring element has a first radius and a second spring portion of the spring element has a second radius, wherein the first radius is greater than the second radius.

6. The contacting device of claim 5, wherein the second spring portion is arranged or is arrangeable to face the contact element, and the first spring portion is arranged or is arrangeable to face the printed circuit board.

7. The contacting device of claim 1, wherein in the operating state of the contacting device, the printed-circuit-board fastening element includes a stop for a spring end of the spring element.

8. The contacting device of claim 1, wherein the contact element includes a sensor and/or an actuator.

9. The contacting device of claim 1, wherein the printed-circuit-board fastening element is fastened in a material-bonding manner on the printed circuit board and/or the spring element is fastened on the contact element.

10. A vehicle system, comprising:
a contacting device for resiliently contacting a printed circuit board with a contact element for a solenoid or a sensor, including a contacting apparatus, including:
a helical spring element, which is clampable between the printed circuit board and the contact element;
a printed-circuit-board fastening element with a fastening surface and a centering surface opposite the fastening surface, wherein the fastening surface is fastened or fastenable on the printed circuit board and, in an operating state of the contacting device, at least one portion of the centering surface is arranged to protrude into an interior-space portion of an interior space of the spring element to guide and/or to center the spring element; and
a pin element with a first end and an opposite second end, wherein the first end is fastened or fastenable on the contact element and the second end is arranged, in the operating state of the contacting device, to protrude into a further interior-space portion of the interior space of the spring element that is opposite the interior-space portion;
wherein the centering surface has an elevation or a convexity, which in the operating state protrudes into the interior-space portion, and
wherein the elevation or convexity of the printed-circuit-board fastening element extends in length over a length portion of a main length of the interior space, wherein the length portion is a fraction of a length of the main length within a range of tolerance of one to 20 percent in terms of a deviation, wherein the main length corresponds to a distance between the printed circuit board and the contact element, and wherein a center axis or longitudinal axis of the spring element extends perpendicularly to a main surface of the printed circuit board and a main surface of the contact element.

11. A method for producing a contacting device, the method comprising:
providing a helical spring element, which is clampable between a printed circuit board and a contact element, and a printed-circuit-board fastening element with a fastening surface and a centering surface opposite the fastening surface, wherein the fastening surface is fastened or fastenable on the printed circuit board;
arranging the spring element between the printed circuit board and the contact element, wherein at least one portion of the centering surface is arranged that, in an operating state of the contacting device, to protrude into an interior-space portion of an interior space of the spring element to guide and/or to center the spring element; and
a pin element with a first end and an opposite second end, wherein the first end is fastened or fastenable on the contact element and the second end is arranged, in the operating state of the contacting device, to protrude into a further interior-space portion of the interior space of the spring element that is opposite the interior-space portion;
wherein the contacting device is for resiliently contacting the printed circuit board with the contact element for the solenoid or the sensor, including a contacting apparatus, including the helical spring element and the printed-circuit-board fastening element, and wherein in an operating state of the contacting device, at least one portion of the centering surface is arranged to protrude into the interior-space portion of the interior space of the spring element to guide and/or to center the spring element;
wherein the centering surface has an elevation or a convexity, which in the operating state protrudes into the interior-space portion, and
wherein the elevation or convexity of the printed-circuit-board fastening element extends in length over a length portion of a main length of the interior space, wherein the length portion is a fraction of a length of the main length within a range of tolerance of one to 20 percent in terms of a deviation, wherein the main length corresponds to a distance between the printed circuit board and the contact element, and wherein a center axis or longitudinal axis of the spring element extends perpendicularly to a main surface of the printed circuit board and a main surface of the contact element.

12. A device for producing a contacting device, comprising:
a non-transitory computer readable storage medium having a computer program, which is executable by a processor, including a program code arrangement having program code for producing the contacting device, by performing the following:
providing a helical spring element, which is clampable between a printed circuit board and a contact element, and a printed-circuit-board fastening element with a fastening surface and a centering surface opposite the fastening surface, wherein the fastening surface is fastened or fastenable on the printed circuit board;
arranging the spring element between the printed circuit board and the contact element, wherein at least one portion of the centering surface is arranged, in an operating state of the contacting device, to protrude into an interior-space portion of an interior space of the spring element to guide and/or to center the spring element; and
a pin element with a first end and an opposite second end, wherein the first end is fastened or fastenable on the contact element and the second end is arranged, in the operating state of the contacting device, to protrude into a further interior-space portion of the interior space of the spring element that is opposite the interior-space portion;
wherein the contacting device is for resiliently contacting the printed circuit board with the contact element for the solenoid or the sensor, including a contacting apparatus, including the helical spring element and the printed-circuit-board fastening element, and wherein in an operating state of the contacting device, at least one portion of the centering surface is arranged to protrude into the interior-space portion of the interior space of the spring element to guide and/or to center the spring element;

wherein the centering surface has an elevation or a convexity, which in the operating state protrudes into the interior-space portion, and wherein the elevation or convexity of the printed-circuit-board fastening element extends in length over a length portion of a main length of the interior space, wherein the length portion is a fraction of a length of the main length within a range of tolerance of one to 20 percent in terms of a deviation, wherein the main length corresponds to a distance between the printed circuit board and the contact element, and wherein a center axis or longitudinal axis of the spring element extends perpendicularly to a main surface of the printed circuit board and a main surface of the contact element.

13. A non-transitory computer readable storage medium having a computer program, which is executable by a processor, comprising:

a program code arrangement having program code for producing a contacting device, by performing the following:

providing a helical spring element, which is clampable between a printed circuit board and a contact element, and a printed-circuit-board fastening element with a fastening surface and a centering surface opposite the fastening surface, wherein the fastening surface is fastened or fastenable on the printed circuit board;

arranging the spring element between the printed circuit board and the contact element, wherein at least one portion of the centering surface is arranged, in an operating state of the contacting device, to protrude into an interior-space portion of an interior space of the spring element to guide and/or to center the spring element; and a pin element with a first end and an opposite second end, wherein the first end is fastened or fastenable on the contact element and the second end is arranged, in the operating state of the contacting device, to protrude into a further interior-space portion of the interior space of the spring element that is opposite the interior-space portion;

wherein the contacting device is for resiliently contacting the printed circuit board with the contact element for the solenoid or the sensor, including a contacting apparatus, including the helical spring element and the printed-circuit-board fastening element, and wherein in an operating state of the contacting device, at least one portion of the centering surface is arranged to protrude into the interior-space portion of the interior space of the spring element to guide and/or to center the spring element;

wherein the centering surface has an elevation or a convexity, which in the operating state protrudes into the interior-space portion, and wherein the elevation or convexity of the printed-circuit-board fastening element extends in length over a length portion of a main length of the interior space, wherein the length portion is a fraction of a length of the main length within a range of tolerance of one to 20 percent in terms of a deviation, wherein the main length corresponds to a distance between the printed circuit board and the contact element, and wherein a center axis or longitudinal axis of the spring element extends perpendicularly to a main surface of the printed circuit board and a main surface of the contact element.

* * * * *